(12) United States Patent
Morin et al.

(10) Patent No.: US 10,658,578 B2
(45) Date of Patent: May 19, 2020

(54) MEMORY CELL COMPRISING A PHASE-CHANGE MATERIAL

(71) Applicant: STMicroelectronics (Crolles 2) SAS, Crolles (FR)

(72) Inventors: Pierre Morin, Kessel-Lo (BE); Didier Dutartre, Meylan (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 16/168,369

(22) Filed: Oct. 23, 2018

(65) Prior Publication Data

US 2019/0131521 A1 May 2, 2019

(30) Foreign Application Priority Data

Oct. 27, 2017 (FR) ...................................... 17 60166

(51) Int. Cl.
*H01L 45/00* (2006.01)
*G11C 13/00* (2006.01)
*H01L 27/24* (2006.01)

(52) U.S. Cl.
CPC .......... *H01L 45/06* (2013.01); *G11C 13/0004* (2013.01); *H01L 45/126* (2013.01); *H01L 45/1233* (2013.01); *H01L 45/1293* (2013.01); *H01L 45/16* (2013.01); *H01L 27/2436* (2013.01)

(58) Field of Classification Search
CPC . H01L 45/06; H01L 45/1233; H01L 45/1293; H01L 45/126; H01L 27/2436
See application file for complete search history.

(56) References Cited

U.S. PATENT DOCUMENTS

| | | |
|---|---|---|
| 2003/0052320 A1 | 3/2003 | Tran et al. |
| 2006/0157679 A1 | 7/2006 | Scheuerlein |
| 2010/0127232 A1 | 5/2010 | Boeve et al. |
| 2012/0051123 A1 | 3/2012 | Liu |
| 2012/0305522 A1 | 12/2012 | Park et al. |
| 2014/0117302 A1 | 5/2014 | Goswami |

OTHER PUBLICATIONS

INPI Search Report and Written Opinion for FR 1760166 dated May 15, 2018 (10 pages).
"Table 104. Thermal conductivity of ceramics" In: James F Shackelford: "Materials Science and Engineering Handbook Third edition", Jan. 1, 2001 (Jan. 1, 2001), CRC Press, XP055472080, ISBN: 0-8493-2696-6 p. 432, * p. 432; tableau 104 *.

(Continued)

*Primary Examiner* — Anthony Ho
(74) *Attorney, Agent, or Firm* — Crowe & Dunlevy

(57) ABSTRACT

A memory cell includes a phase-change material. A via is connected to a transistor and an element for heating the phase-change material. A layer made of a material (which is one of electrically insulating or has an electric resistivity greater than $2.5 \cdot 10^{-5}$ $\Omega \cdot m$ and which is sufficiently thin to be crossable by an electric current due to a tunnel-type effect) is positioned between the via and the heating element. Interfaces between the layer and materials in contact with surfaces of said layer form a thermal barrier.

16 Claims, 5 Drawing Sheets

(56) References Cited

OTHER PUBLICATIONS

Elah Bozorg-Grayeli et al: "Temperature-Dependent Thermal Properties of Phase-Change Memory Electrode Materials", IEEE Electron Device Letters, vol. 32, No. 9, Jun. 27, 2011 (Jun. 27, 2011), pp. 1281-1283, XP011381493, IEEE Service Center, New York, NY, US ISSN: 0741-3106, DOI: 10.1109/LED.2011.2158796 * p. 1281, colonne 1, ligne 21-ligne 22 *.
Jagannadham Kasichainula: "Thermal conductivity of nitride films of Ti, Cr, and W deposited by reactive magnetron sputtering", Journal of Vacuum Science and Technology: Part A, AVS /AIP, Melville, NY., US, vol. 33, No. 3, Apr. 1, 2015 (Apr. 1, 2015), XP012197073, ISSN: 0734-2101, DOI: 10.1116/1.4919067 [extrait le Jan. 1, 1901] * p. 8; tableau II *.
Ashvini Gyanathan et al: "Multi-Level Phase Change Memory Cells with SiN or $Ta_{2}O_{5}$ Barrier Layers", Japanese Journal of Applied Physics, vol. 51, No. 2, Feb. 1, 2012 (Feb. 1, 2012), p. 02BD08, XP055653778, JP ISSN: 0021-4922, DOI: 10.1143/ JJAP. 51.02BD08.
Jimenez-Molinos F et al: "Direct and trap-assisted elastic tunneling through ultrathln gate oxides", Journal of Applied Phyiscs, American Institute of Physics, US, vol. 91, No. 8, Apr. 15, 2002 (Apr. 15, 2002), pp. 5116-5124, XP012056234, ISSN: 0021-8979, DOI 10.1063/ 1.1461062.
Kim Breitfelder: "The Authoritative Dictionary of IEEE Standards Terms", IEEE Standards Terms, Jan. 1, 2000 (Jan. 1, 2000), XP055653994, [extrait le Dec. 18, 2019].
Seungjae Jung et al: "Thermally-assisted Ti/Pr 0.7 Ca 0.3 MnO 3 ReRAM with excellent switching speed and retention characteristics", Electron Devices Meeting (IEDM), 2011 IEEE International, IEEE, Dec. 5, 2011 (Dec. 5, 2011), pp. 3.6.1-3.6.4, XP032095875, DOI: 10.1109/IEDM.2011.6131483 ISBN: 978-1-4577-0506-9.
First Office Action from co-pending EP Appl. No. 18202885.2 dated Jan. 3, 2020 (8 pages).

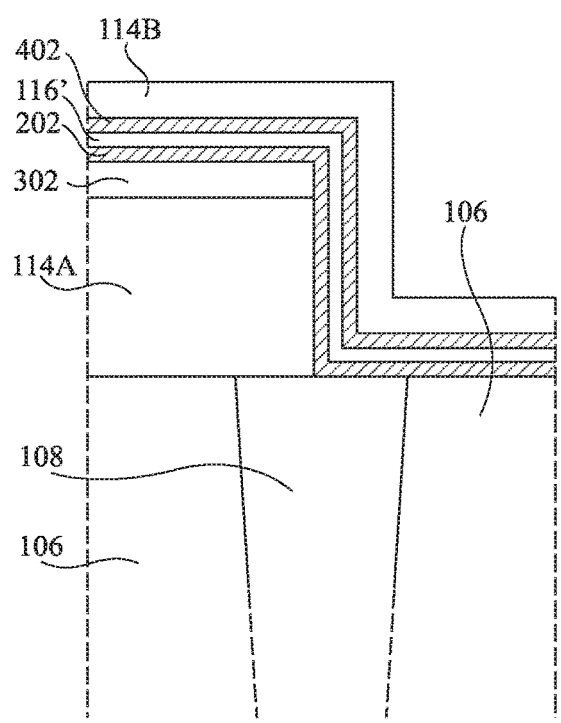
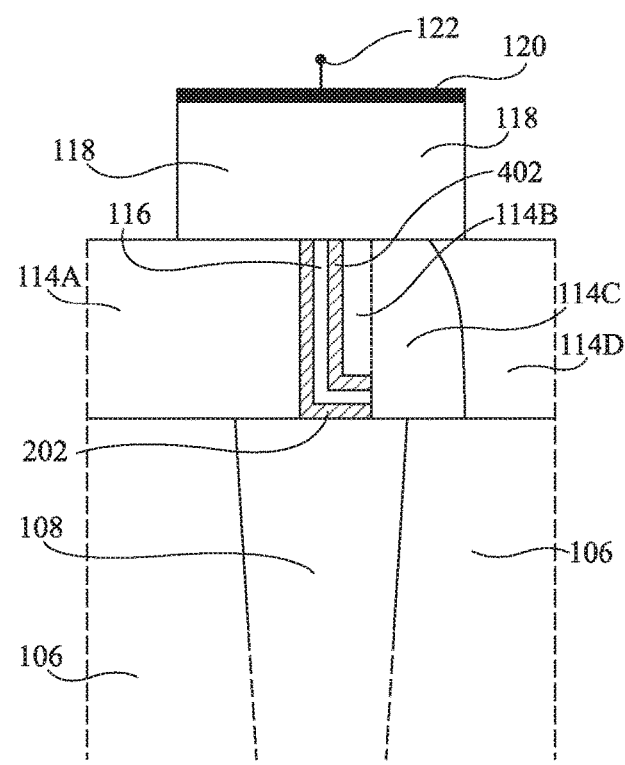
Fig 4A
Fig 4B
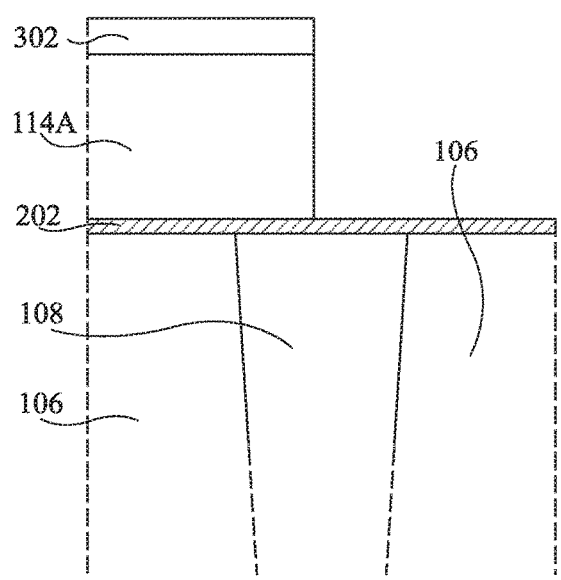
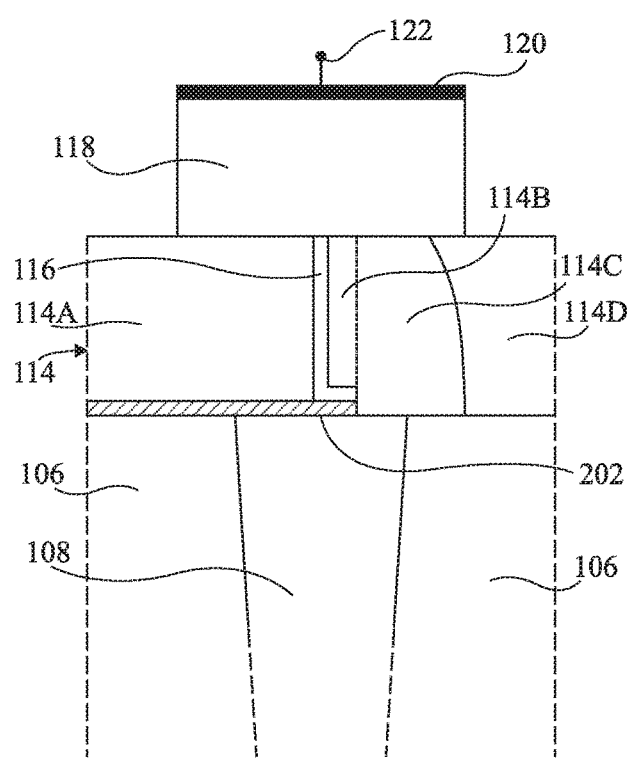
Fig 5A
Fig 5B

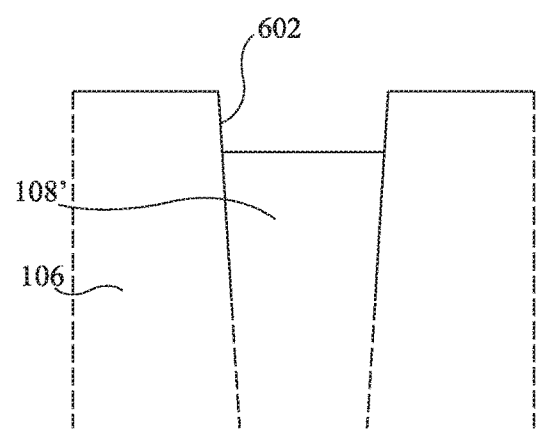
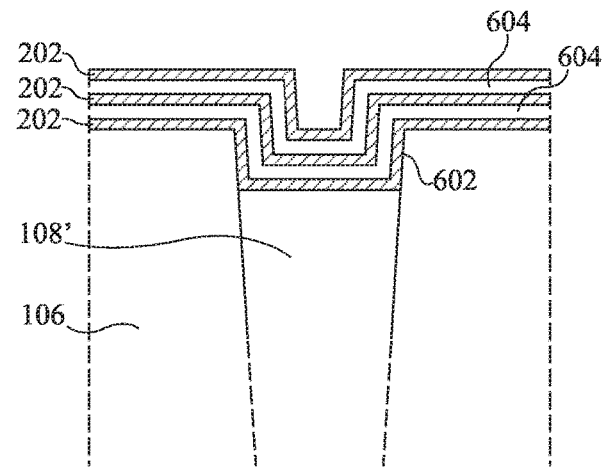
Fig 6A                                      Fig 6B
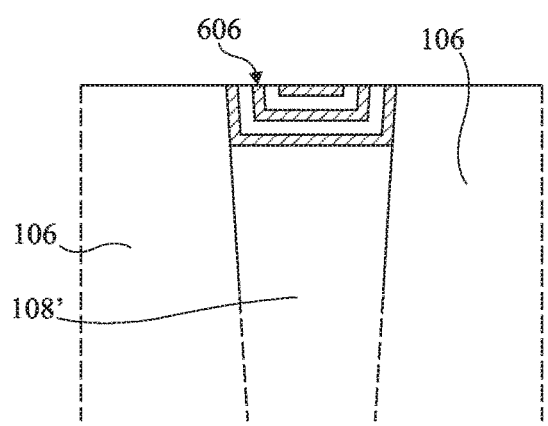
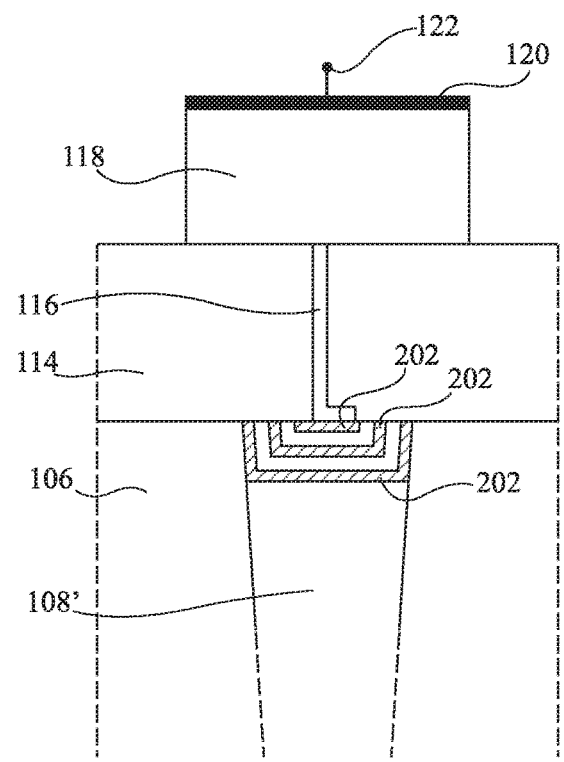
Fig 6C                                      Fig 6D

MEMORY CELL COMPRISING A PHASE-CHANGE MATERIAL

PRIORITY CLAIM

This application claims the priority benefit of French Application for Patent No. 1760166, filed on Oct. 27, 2017, the content of which is hereby incorporated by reference in its entirety to the maximum extent allowable by law.

TECHNICAL FIELD

The present disclosure relates to electronic chips, and more particularly to a non-volatile memory cell comprising a phase-change material.

BACKGROUND

In a memory cell comprising a phase-change material, the phase-change material is, for example, a crystalline chalcogenide. To program such a memory cell, the chalcogenide is heated to melt a portion thereof. After the heating has stopped, the molten portion cools down sufficiently fast to become amorphous. The erasing of the memory cell is obtained by heating the chalcogenide without melting it, so that the amorphous portion recrystallizes. The reading of the programmed or erased state of the memory cell uses the difference between the electric conductivity of the amorphous chalcogenide and of the crystalline chalcogenide.

Known phase-change memory cells have various disadvantages, such as a need for a high current during programming, and various compactness problems. Such issues are crucial, for example, for an electronic chip comprising several millions, or even several billions, of such memory cells.

SUMMARY

An embodiment provides overcoming all or part of the above disadvantages.

Thus, an embodiment provides a memory cell comprising a phase-change material comprising, on a via of connection to a transistor, an element for heating the phase-change material and, between the via and the heating element, a layer made of a material which is electrically insulating or which has an electric resistivity greater than $2.5 \cdot 10^{-5}$ $\Omega \cdot m$, the interfaces between said layer and the materials in contact with the two surfaces of said layer forming a thermal barrier, said layer being sufficiently thin to be able to be crossed by an electric current due to a tunnel-type effect.

According to an embodiment, said layer has a thickness smaller than 1 nm.

According to an embodiment, each of said interfaces forms an interfacial thermal resistor having a resistance greater than $10^{-8}$ $m^2 \cdot K/W$.

According to an embodiment, the material of said layer belongs to the group comprising: silicon nitride; aluminum oxide; hafnium oxide; silicon oxide; silicon; silicon-germanium; and germanium.

According to an embodiment, the heating element is a wall in an insulating region, and said layer continues between the wall and the insulating region on one of the surfaces of the wall, the interface between the materials of said layer and of the insulating region forming an interfacial thermal resistor.

According to an embodiment, the memory cell comprises, on the other surface of the wall, an additional layer made of an electrically-insulating material, the interface between said additional layer and the insulating region forming an interfacial thermal resistor.

According to an embodiment, the memory cell comprises, between the via and the heating element, a plurality of layers made of a material which is electrically insulating or which has an electric resistivity greater than $2.5 \cdot 10^{-5}$ $\Omega \cdot m$, and electrically-conductive layers interposed between the layers made of electrically-insulating material, the interfaces between the layers of electrically-insulating material and the electrically-conductive layers forming thermal barriers, and the layers of electrically-insulating material being sufficiently thin to be able to be crossed by a current.

According to an embodiment, the electrically-conductive layers are made of tungsten and said electrically-insulating material is aluminum oxide.

An embodiment provides a method of forming a memory cell comprising a phase-change material, comprising: a) forming a via of series connection with a transistor; b) forming on the via an element for heating the phase-change material; and c) between steps a) and b), forming a layer made of a material which is electrically insulating or which has an electric resistivity greater than $2.5 \cdot 10^{-5}$ $\Omega \cdot m$ capable of forming at step b) an interfacial thermal barrier with the materials in contact with the two surfaces of the layer, said layer being sufficiently thin to be able to be crossed by a current due to a tunnel-type effect.

According to an embodiment, the method comprises, between steps a) and b), the step of: a1) covering the structure with an insulating layer; and a2) etching said insulating layer across its entire thickness outside of a portion of said insulating layer, one side of said portion being located on the via, the heating element being formed on said side.

According to an embodiment, step c) takes place before step a1).

According to an embodiment, step c) takes place after step a2).

The foregoing and other features and advantages will be discussed in detail in the following non-limiting description of specific embodiments in connection with the accompanying drawings.

BRIEF DESCRIPTION OF THE DRAWINGS

FIGS. 4A and 4B are partial simplified cross-section views illustrating steps of a variation of the method of FIGS. 3A to 3D;

FIGS. 5A and 5B are partial simplified cross-section views illustrating steps of another embodiment of a method of manufacturing a memory cell comprising a phase-change material; and FIGS. 6A to 6D are partial simplified cross-section views illustrating steps of another embodiment of a method of manufacturing a memory cell comprising a phase-change material.

DETAILED DESCRIPTION

Figure 1:
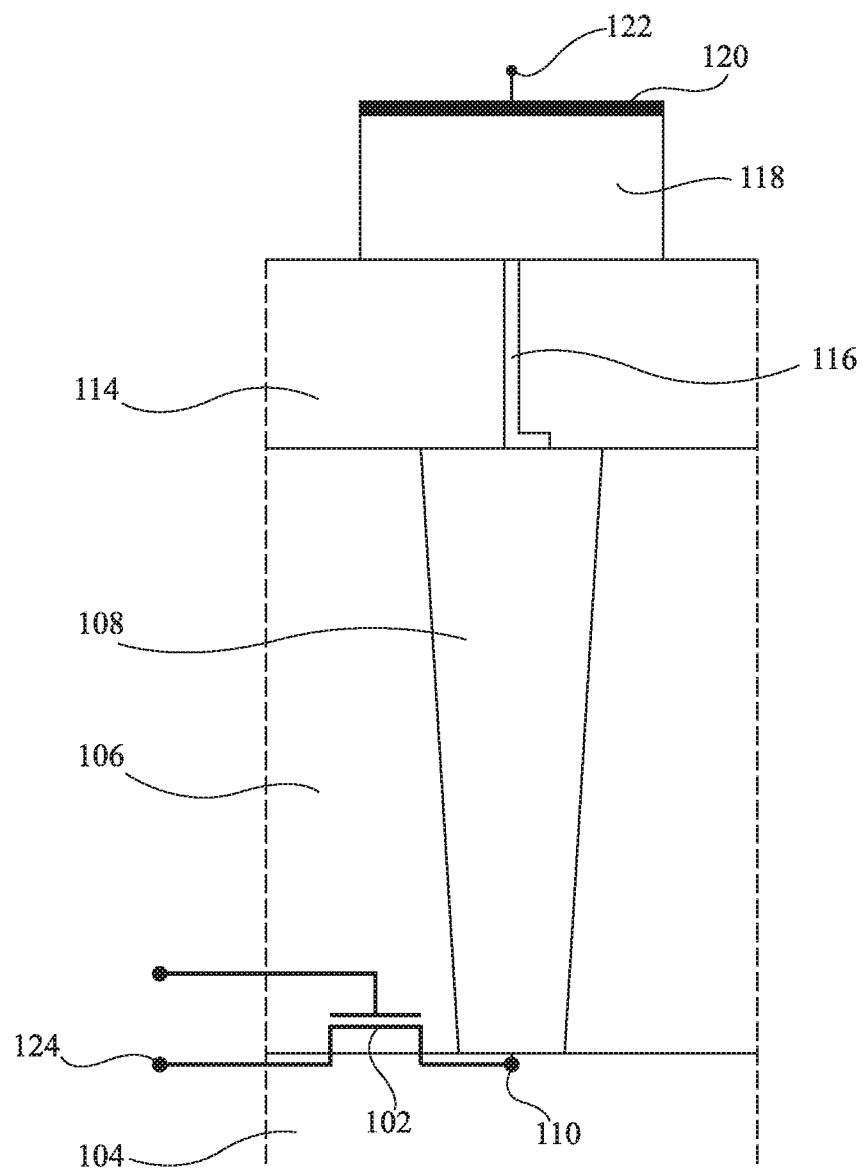
FIG. 1 is a simplified cross-section view of a memory cell comprising a phase-change material.

The same elements have been designated with the same reference numerals in the various drawings and, further, the various drawings are not to scale. For clarity, only those steps and elements which are useful to the understanding of the described embodiments have been shown and are detailed.

In the following description, when reference is made to terms qualifying absolute positions, such as terms "high", "low", etc., or relative positions, such as terms "above", "under", "upper", "lower", etc., or to terms qualifying orientation, such as term "horizontal", "vertical", reference is made to the orientation of the concerned element in the drawings, it being understood that in practice, the described devices may be oriented differently.

FIG. 1 is a simplified cross-section view of a memory cell comprising a phase-change material.

A transistor 102, for example, of MOS type, but which may also be of bipolar type, is formed inside and on top of a semiconductor support (substrate) 104. This transistor is symbolically represented to include a source, a drain and an insulated gate. Transistor 102 and support 104 are covered with an electrically-insulating layer 106, for example, made of silicon oxide. An electrically-conductive via 108, for example, made of tungsten, thoroughly crosses layer 106 and has its lower end in contact with drain 110 of transistor 102. Layer 106 and via 108 are covered with an electrically-insulating layer 114, for example, made of silicon nitride, thoroughly crossed by a resistive element 116. Resistive element 116 is arranged on via 108 and is in contact with via 108. The resistive element is for example made of titanium silicon nitride TiSiN and typically has the shape of a wall with a thickness for example in the range from 2 to 10 nm, with a width for example greater than 15 nm and a height for example in the range from 30 to 150 nm. Resistive element 116 and insulating layer 114 are topped with a phase-change material 118 covered with a contacting area 120 connected to a node 122. Phase-change material 118, resistive element 116, and transistor 102 are thus electrically connected in series between node 122 and source 124 of transistor 102.

To program or erase the memory cell, the memory cell is selected by the turning-on of transistor 102 and a voltage is applied between node 122 and source 124. A current runs through the resistive element, which generates heat, and the temperature of the resistive element strongly rises. The phase-change material in contact with resistive heating element 116 melts (for the programming) or recrystallizes (for the erasing).

A problem is that part of the generated heat, rather than being used to raise the temperature of heating element 116 and thus to melt or recrystallize material 118, is absorbed or dissipated by the materials surrounding the heating element, particularly by conductive via 108, according to the dimensions and the materials of the via. A large amount of heat then has to be generated to obtain, in the heating element, a temperature sufficient for the memory cell to be programmed or erased. This results in the issue, mentioned above, of the need for high programming and erasing currents. Transistor 102 should have large dimensions to allow the flowing of such currents, which poses the above-mentioned compactness problems.

A memory cell with decreased programming and erasing currents is provided hereafter, which memory cell can then be particularly compact.

Figure 2:
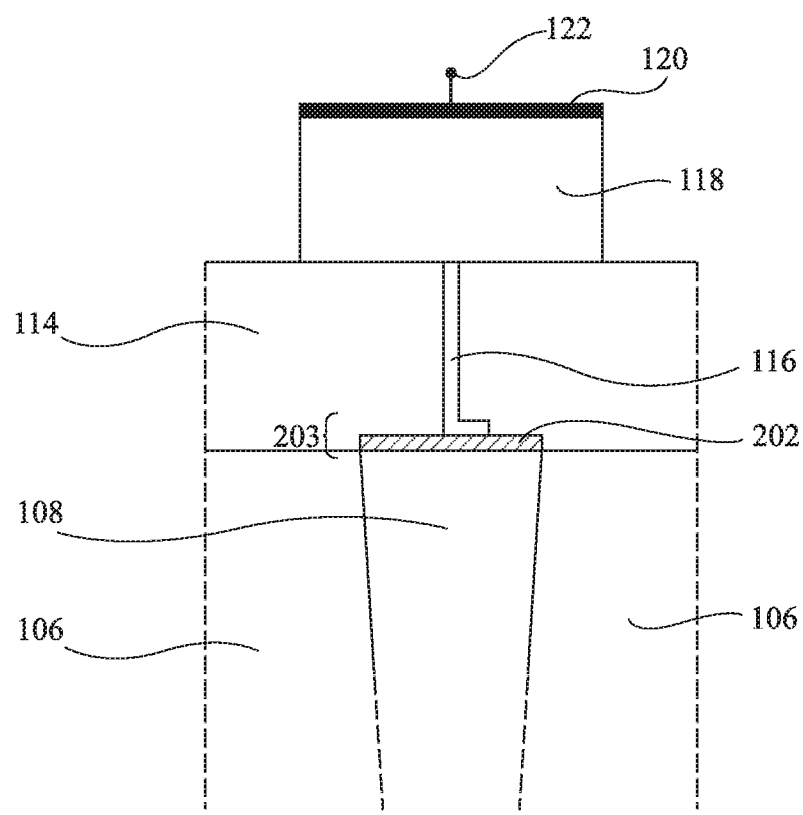
FIG. 2 is a partial simplified cross-section view of an embodiment of a memory cell comprising a phase-change material.

FIG. 2 is a partial simplified cross-section view of an embodiment of a memory cell. Only the upper portions of the memory cells are shown in FIG. 2 and the following.

The memory cell of FIG. 2 comprises the elements of the memory cell of FIG. 1, or similar elements, arranged identically or similarly, with the difference that a thermal barrier 203 is arranged between via 108 and resistive heating element 116, the thermal barrier enabling current to flow between the via and element 116.

The thermal barrier enables to strongly decrease losses towards via 108 of the heat generated in heating element 116. A decreased amount of generated heat is then sufficient for the temperature of heating element 116 to strongly rise and for the memory cell to be programmed or erased. The programming and erasing currents are thus decreased.

Thermal barrier 203 here results from the interfaces between a layer 202 made of an electrically-insulating material and the materials of via 108 and of element 116.

Indeed, the difference between the material of layer 202 and the materials of via 108 and of heating element 116 results, on each side of layer 202, in an interfacial thermal resistance, that is, a resistance which opposes the flowing of heat between two different materials in contact with each other. Such an interfacial resistance, for example, appears when the vibrations, or phonons, of the crystal lattices of the materials propagate differently in the two materials, and/or have different frequencies in the two materials. Phonons then tend to be reflected by the interface. The interfacial thermal resistances thus obtained between electrically insulating and conductive materials are particularly high, for example greater than $10^{-8}$ m$^2$·K/W. Thereby the interfaces of layer 202 with the materials in contact with its two surfaces form a particularly efficient thermal barrier 203. The programming and erasing currents are then particularly decreased.

The electric current, particularly for the programming and erasing, flows from resistive material 116 to via 108 due to a phenomenon of tunnel effect type. To achieve this, it is provided for layer 202 to be sufficiently thin. As an example, when the material of layer 202 is made of silicon nitride, or of aluminum, hafnium, or silicon oxide, layer 202 has a thickness for example smaller than 1 nm. Layer 202 may also be made of a non-doped semiconductor material, for example, silicon, germanium, or silicon-germanium, crystalline or amorphous, or of a material having an electric resistivity greater than $2.5 \cdot 10^{-5}$ Ω·m.

FIGS. 3A to 3D are partial simplified cross-section views illustrating successive steps of an embodiment of a method of manufacturing a memory cell, for example, of the type in FIG. 2.

Figure 3A:
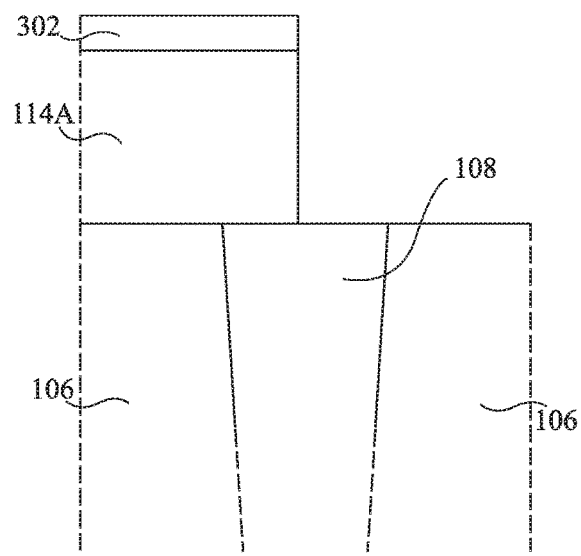
FIGS. 3A to 3D are partial simplified cross-section views illustrating steps of an embodiment of a method of manufacturing a memory cell comprising a phase-change material.

At the step of FIG. 3A, a via 108, for example, made of tungsten, connected to the drain of a transistor, not shown, has been formed in an insulating layer 106, for example, made of silicon oxide. Via 108 is flush with the upper surface of insulating layer 106, for example after a chemical-mechanical polishing (CMP).

The structure is then covered with an electrically-insulating layer 114A, for example, made of silicon nitride, and then with a layer 302, for example, made of silicon oxide. Layer 114A is a portion of a future electrically-insulating layer 114 crossed by a future resistive heating element. As an example, the thickness of layer 114 is in the range from 30 to 150 nm. Layers 302 and 114A are then etched so that the side of the remaining portions of these layers is located on via 108.

Figure 3B:
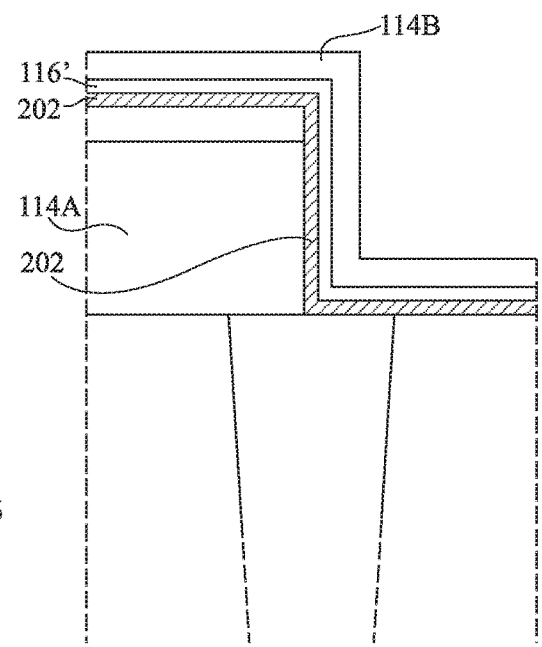

At the step of FIG. 3B, a layer 202, a layer 116', and a layer 114B are successively conformally formed on the structure. Layer 202 corresponds to that of FIG. 2 and is intended to form the future thermal barrier. The future resistive heating element will be formed of a portion of layer 116', layer 116' for example being made of titanium silicon nitride. Layer 114B is electrically insulating, for example, made of silicon nitride, and has a thickness for example in the range from 30 to 50 nm.

Figure 3C:
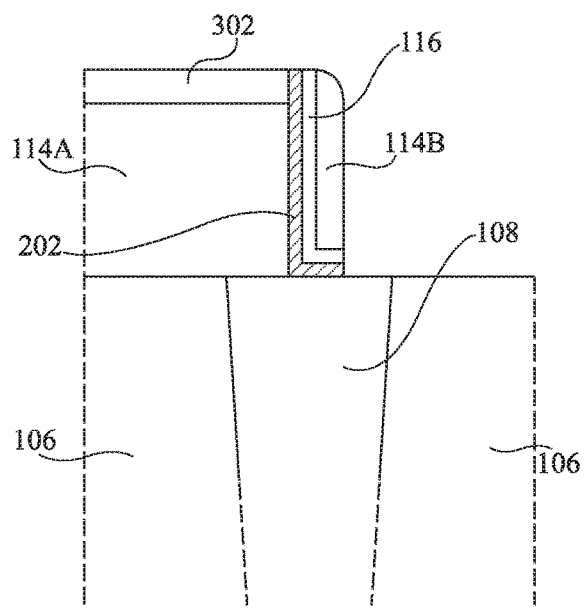

At the step of FIG. 3C, the horizontal portions of layer 114B are removed by anisotropic etching. The accessible portions of layers 116' and 202 are then etched.

Figure 3D:
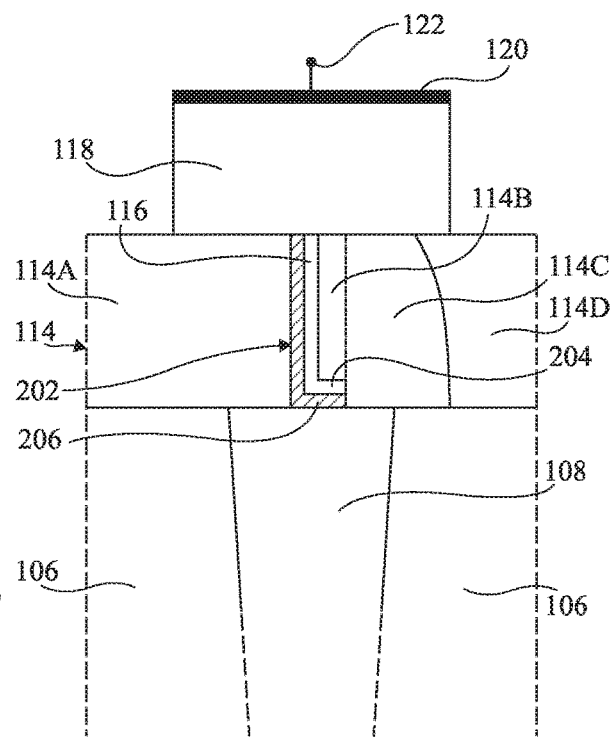

At the step of FIG. 3D, a layer 114C made of an electrically-insulating material, for example, of silicon nitride, is successively deposited. The horizontal portions of layer 114C are etched. This results in a portion of layer 114C covering the vertical remaining portion of layer 114B.

The structure is then covered with an electrically-insulating layer 114D, for example, made of silicon oxide, to fill all the space which has remained free under the upper level of layer 114A.

After this, all the elements of the structure located above the upper level of layer 114A are removed, for example, by chemical-mechanical polishing (CMP), after which a region made of a phase-change material 118, covered with a contacting area 120, is formed.

One thus obtains, in an insulating layer 114 formed of the remaining portions of layers 114A, 114B, 114C, and 114D, a resistive element 116 for heating phase-change material 118, and a thermal barrier. Resistive element 116 obtained by the above-described method comprises a vertical wall and a horizontal portion 204 which extends on one side from the bottom of the wall.

The thermal barrier comprises a portion 206 of layer 202 located between via 108 and heating element 116. Starting from portion 206, layer 202 extends vertically, on one of the surfaces of the wall, between the wall and the remaining portion of insulating layer 114A, all the way to phase-change material 118.

Preferably, the material of layer 202 is provided to create with that of insulating layer 114A a high interfacial thermal resistance, for example, greater than $2 \cdot 10^{-9}$ m$^2$·K/W. Such an interfacial thermal resistance is located between layer 114A and heating element 116. The leakage to layer 114A of the heat generated in the heating element is thus limited. The memory cell may then be programmed or erased with a particularly low current.

The interfacial thermal resistance located between layer 114A and heating element 116 and the thermal barrier between via 108 and element 116 are obtained from the interfaces of a same layer 202 with the surrounding materials, and are thus obtained in a particularly simple manner.

It should be noted that, if the material of layer 202 was electrically conductive, for example, with an electric resistivity greater than $2.5 \cdot 10^{-5}$ Ω·m, part of the current flowing through the memory cell would flow from via 108 to material 118 through layer 202 rather than through element 116. This part of the current would thus not be used for the heating of element 116, which would result in an increase of the programming and erasing currents. This is avoided due to the fact that layer 202 is made of an electrically-insulating material. Providing layer 202 made of an electrically-insulating material enables to obtain, with the interfaces of a same layer 202 with the surrounding materials, simultaneously the interfacial thermal resistance located between layers 114A and element 116, and the thermal barrier between via 108 and heating element 116.

FIGS. 4A and 4B are partial simplified cross-section views illustrating steps of a variation of the method of FIGS. 3A to 3D.

The step of FIG. 4A corresponds to that of FIG. 3B and differs from the step of FIG. 3B in that an electrically-insulating layer 402 is conformally deposited between layers 116' (future heating element) and 114B (future portion of insulating layer 114). The material of layer 402 is selected to form, in contact with that of layer 114B, a high interfacial thermal resistor, for example, having a resistance greater than $2 \cdot 10^{-9}$ m$^2$·W/K. As an example, layer 402 is made of hafnium, aluminum, or silicon oxide, or of non-doped semiconductor, for example, amorphous. As an example, the thickness of layer 402 is in the range from 1 to 5 nm.

The step of FIG. 4B corresponds to that of FIG. 3D, at which the memory cell is obtained. A thermal barrier is formed by the interfaces of a portion of layer 402 with layer 114B. The thermal barrier is located between heating element 116 and the remaining vertical portion of layer 114B.

The provision of layer 402 forming an interfacial thermal barrier with layer 114B enables to decrease heat losses from the heating element to the remaining portion of layer 114B. The memory cell can then be programmed or erased with particularly low currents.

FIGS. 5A and 5B are partial simplified cross-section views illustrating steps of another embodiment of a memory cell manufacturing method. The method of FIGS. 5A and 5B differs from that of FIGS. 3A to 3D in that layer 202 (future element of a thermal barrier) is formed before the forming and the etching of layers 114A and 302.

Thus, at the step of FIG. 5A, after having covered layer 106 and via 108 successively with layers 202, 114A, and 302, a portion of layers 302 and 114A is removed so that the side of the remaining portions of layers 114A and 302 is located above via 108. The accessible portions of layer 202 are then etched.

At the step of FIG. 5B, the rest of the memory cell has been shown as previously described in relation with FIGS. 3B to 3D, omitting layer 202 which has already been formed.

The memory cell obtained by the method of FIGS. 5A and 5B differs from that of FIGS. 3B to 3D in that layer 202 extends under insulating layer 114A instead of extending over a surface of the heating element.

FIGS. 6A to 6D are partial simplified cross-section views illustrating steps of another embodiment of a memory cell manufacturing method.

At the step of FIG. 6A, in an insulating layer 106, a via 108', for example, made of tungsten, connected to a transistor, not shown, is formed. Via 108' partially fills a hole 602 crossing layer 106, and does not reach the upper surface of layer 106. As an example, to obtain via 108', hole 602 is first filled with tungsten, after which a chemical-mechanical polishing (CMP) removing all the elements located above the upper surface of layer 106 is carried out, after which the upper portion of the tungsten filling the hole is partially and selectively etched. As an example, the upper level of via 108' is from 5 to 50 nm below that of the upper surface of layer 106.

At the step of FIG. 6B, layers 202 made of an electrically-insulating material, for example, of aluminum oxide, alternating with layers 604 made of electrically-conductive material, for example, of tungsten, are successively deposited, for example, conformally. Each electrically-insulating layer is sufficiently thin to enable current to flow. As an example, the thickness of each layer 202 is smaller than 1 nm. As an example, the thickness of each layer 604 is in the range from 1 to 5 nm. Three layers 202 and two layers 604 interposed between layers 202 are shown as an example. Preferably, from 2 to 10 layers 202 are provided. The upper layer is a layer 202 in the shown example, but may also be one of layers 604. The stack for example totally fills the portion of hole 602 located above the via.

At the step of FIG. 6C, the elements located above the upper surface level of layer 106 are removed. This results in a portion 606 of the stack of layers 202 located under via 108' and extending in line with via 108'. Portion 606 of the stack is flush with the upper surface of layer 106.

At the step of FIG. 6D, the rest of the memory cell is formed, that is, an insulating layer 114 crossed by a heating element 116, insulating layer 114 being topped with a phase-change material 118 located on the heating element. The heating element is formed on portion 606 of the stack.

In the obtained memory cell, an interfacial thermal resistor is formed by each contact between materials of layers 202 and 604. There thus is a plurality of thermal barriers between via 108' and the heating element. As a result, the heating element is particularly well thermally insulated from the via. The memory cell can thus be programmed or erased by the flowing of a particularly low current.

Specific embodiments have been described. Various alterations, modifications, and improvements will occur to those skilled in the art. In particular, although layer 202 of the thermal barrier of FIG. 2 is directly in contact with the via and with the heating element, electric conductors may be provided between layer 202 and the via, and/or between layer 202 and the heating element, the essential point being for the interfaces of layer 202 with the materials in contact with the two surfaces of layer 202 to form a thermal barrier.

Various embodiments with various variations have been described hereabove. It should be noted that those skilled in the art may combine various elements of these various embodiments and variations without showing any inventive step. In particular, one may provide in the method of FIGS. 5A and 5B an electrically-insulating layer 402 similar to that of the variation of FIGS. 4A and 4B, between layers 116' (corresponding to the heating element) and 114B (corresponding to insulating layer 114). An additional thermal barrier, similar to that formed by layer 402 of FIG. 4B, is then obtained between the heating element and insulator 114B.

In the method of FIGS. 5A and 5B, instead of a single layer 202, a plurality of layers 202 separated from conductive layers, for example, made of tungsten, may be formed. A plurality of thermal barriers are thus obtained between the heating element and the via.

Further, the various embodiments and variations of the methods of FIGS. 3A to 5B may be implemented by replacing via 108 with via 108' topped with portion 606 of the structure obtained at the step of FIG. 6C.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A memory cell, comprising:
  a via connected to a transistor;
  a phase-change material;
  a heating element extending between the via and the phase-change material, said heating element configured to heat the phase-change material; and
  positioned between the via and the heating element, at least one layer made of a material which is one of electrically insulating or having an electric resistivity greater than $2.5 \times 10^{-5}$ $\Omega \cdot m$;
  wherein interfaces between two surfaces of said at least one layer and materials of the via and the heating element in contact with the two surfaces of said at least one layer form a thermal barrier;
  wherein said at least one layer has a thickness such that said at least one layer is crossable by an electric current due to a tunnel-type effect.

2. The memory cell of claim 1, wherein the thickness of said at least one layer is smaller than 1 nm.

3. The memory cell of claim 1, wherein each of said interfaces forms an interfacial thermal resistor having a resistance greater than $10^{-8}$ $m^2$ K/W.

4. The memory cell of claim 1, wherein the at least one layer is made of a material selected from the group consisting of: silicon nitride; aluminum oxide; hafnium oxide; silicon oxide; silicon; silicon-germanium; and germanium.

5. The memory cell of claim 1, wherein the heating element is a wall extending through an insulating region, and said at least one layer is further positioned between the wall and the insulating region on one surface of the wall, wherein an interface between the at least one layer and the insulating region forms an interfacial thermal resistor.

6. The memory cell of claim 5, comprising, on another surface of the wall, an additional layer made of an electrically-insulating material, wherein an interface between said additional layer and the insulating region forms a further interfacial thermal resistor.

7. The memory cell of claim 1, wherein the at least one layer comprises a plurality of layers positioned between the via and the heating element, each layer of the plurality of layers made of the material which is at least one of electrically insulating or having an electric resistivity greater than $2.5 \cdot 10^{-5}$ $\Omega \cdot m$, and further comprising an electrically-conductive layer interposed between layers of said plurality of layers, wherein interfaces between each layer of the plurality of layers and each electrically conductive layer form a thermal barrier.

8. The memory cell of claim 7, wherein the electrically-conductive layers are made of tungsten and said electrically-insulating material is aluminum oxide.

9. A memory cell, comprising:
  a via connected to a transistor and having a top surface;
  a tunnel layer made of a material which is one of electrically insulating or having an electric resistivity greater than $2.5 \times 10^{-5}$ $\Omega \cdot m$ but which has a thickness such that the tunnel layer is crossable by an electric current due to a tunnel-type effect;
  an insulating layer over said tunnel layer;
  a phase-change material over said insulating layer; and
  a heating element extending through said insulating layer between the tunnel layer and the phase-change material.

10. The memory cell of claim 9, wherein the tunnel layer completely covers the top surface of the via.

11. The memory cell of claim 10, wherein the tunnel layer does not extend beyond the top surface of the via.

12. The memory cell of claim 9, wherein the tunnel layer only partially covers the top surface of the via.

13. The memory cell of claim 12 wherein the tunnel layer extends beyond the top surface of the via.

14. The memory cell of claim 9 wherein the tunnel layer extends between the heating element and the insulating layer.

15. The memory cell of claim 9, wherein the tunnel layer is formed by a stack of a plurality of first layers made of the material which is one of electrically insulating or having an electric resistivity greater than $2.5 \times 10^{-5}$ $\Omega \cdot m$ but which has a thickness crossable by an electric current due to a tunnel-type effect, said stack further including a second layer made of an electrically conductive material positioned between adjacent ones of the first layers.

16. The memory cell of claim 15, wherein the via extends through an insulating layer having a top surface, and wherein the top surface of the via is below the top surface of the insulating layer, and wherein the stack in positioned in a hole between the top surface of the via and the top surface of the insulating layer.

\* \* \* \* \*